United States Patent [19]

Koumura et al.

[11] Patent Number: 5,167,697
[45] Date of Patent: Dec. 1, 1992

[54] SUBSTRATE MATERIAL FOR MOUNTING SEMICONDUCTOR DEVICE THEREON AND MANUFACTURING METHOD THEREOF

[75] Inventors: Takeshie Koumura; Yoshihiro Umeda; Jitsuo Matsumoto, all of Fukuoka, Japan

[73] Assignee: Nippon Tungsten Co., Ltd., Fukuoka, Japan

[21] Appl. No.: 686,465

[22] Filed: Apr. 17, 1991

[30] Foreign Application Priority Data

Jun. 18, 1990 [JP] Japan .................................. 2-159446

[51] Int. Cl.$^5$ .............................................. B22F 9/00
[52] U.S. Cl. ........................................ 75/247; 75/248; 419/27; 419/32; 419/38; 419/47
[58] Field of Search ................. 419/27, 32, 38, 47; 428/569; 75/228, 247, 248

[56] References Cited

U.S. PATENT DOCUMENTS

| | | | |
|---|---|---|---|
| 3,382,066 | 5/1968 | Kenney et al. | 75/208 |
| 3,440,043 | 4/1969 | Zdanuk et al. | 75/208 |
| 3,721,550 | 3/1973 | Schreiner et al. | 75/208 R |
| 4,123,265 | 10/1978 | Takahashi et al. | 75/211 |
| 4,153,755 | 5/1979 | Rothkegel et al. | 428/569 |
| 4,271,372 | 6/1981 | Geldner et al. | 313/330 |
| 4,299,889 | 11/1981 | Kato et al. | 428/569 |
| 4,430,124 | 2/1984 | Kato | 75/248 |
| 4,640,999 | 2/1987 | Kashiwagi et al. | 200/144 B |

Primary Examiner—Brooks H. Hunt
Assistant Examiner—Daniel Jenkins
Attorney, Agent, or Firm—Nikaido, Marmelstein, Murray & Oram

[57] ABSTRACT

A substrate material for mounting a semiconductor device thereon, comprises a skeleton prepared by liquid-phase presintering the composition of W and/or Mo powder in which Cu and/or Ag powder is uniformly dispersed, and a Cu and/or Ag phase infiltrated into the pores of the skeleton. The total amount of Cu and/or Ag in the product is adjusted to 10-50 vol. %. The substrate material is manufactured by two steps of: presintering the Cu and/or Ag-contng. powdery composition to form a porous skeleton, and infiltrating Cu and/or Ag into the pores of the skeleton. Since the skeleton contng. Cu and/or Ag exhibits an excellent affinity to molten Cu and/or Ag, the infiltration of molten Cu and/or Ag is performed uniformly into every nook and corner of the skeleton. Consequently, the obtained product is free from pores which would deteriorate a junction plane between the substrate and a semiconductor device mounted thereon.

5 Claims, 2 Drawing Sheets

SUBSTRATE MATERIAL FOR MOUNTING SEMICONDUCTOR DEVICE THEREON AND MANUFACTURING METHOD THEREOF

BACKGROUND OF THE PRESENT INVENTION

The present invention is related to a material suitable for a substrate on which a semiconductor device is mounted and a method of manufacturing said substrate material. The new material is excellent in thermal conductivity capable of efficiently releasing heat generated in a semiconductor device and has a thermal expansion coefficient similar to that of the semiconductor device.

In case where a material to be used as a substrate for mounting a semiconductor device thereon has a thermal expansion coefficent different from that of the semiconductor device, defects such as cracking or splitting are likely to occur in the semiconductor device, the substrate material or the junction plane therebetween due to thermal stress. In addition, when the heat diffusion from the semiconductor device is insufficient, the semiconductor device is heated at a temperature exceeding its rated value, resulting in malfunction or troubles. In this regards, the substrate material is required to have a thermal expansion coefficient similar to that of the semiconductor device, and sufficient thermal conductivity to maintain the semiconductor device at a temperature below its rated value.

Various kinds of substrate materials to satisfy the above mentioned requirements have been proposed. For instance, metallic materials, e.g. W, Mo, Coval or Alloy #42, and ceramic materials, e.g. alumina or beryllia have been used as substrates for mounting a semiconductor device thereon. In the case where excellent thermal conductivity is especially requested, copper alloys have been used as substrate materials.

By the way, the technology for improving the function of semiconductor devices and integrating semiconductor devices has been remarkably developing day by day. For instance, semiconductor devices are made larger in scale, and with high density more functions are incorporated in one element. Accompanied with these trends, the amount of heat generated in a semiconductor being used becomes larger. As a consequence, a substrate for mounting a semiconductor device thereon is required to have a thermal expansion coefficient similar to those of a semiconductor device and a package material as well as excellent thermal conductivity to efficiently diffuse heat generated in the semiconductor device.

In order to satisfy these requirements, there is proposed to disposed a sintered body as an electrode between a Si device and a copper terminal plate by Japanese Patent Application Laid-Open 50-62776. The sintered body contains components such as Cu or Ag, which are excellent in thermal conductivity and other components such as W or Mo, which are excellent in heat resistance. A substrate material proposed by Japanese Patent Application Laid-Open 59-21032 is a sintered body manufactured by impregnating a porous W presintered body with copper.

As for these sintered bodies, the thermal expansion coefficient and thermal conductivity may be freely determined by changing the content of Cu or Ag. When there is used a sintered body containing a proper amount of Cu or Ag most suitable for the material of a semiconductor device to be mounted as well as the configuration and the size of a package, it is expected to obtain a substrate having excellent thermal conductivity and a thermal expansion coefficient similar to that of a semiconductor device to be mounted thereon.

A Cu-W composite material has been manufactured by a powder metallurgy process. When a composite material containing a small amount of copper is to be manufactured, an impregnation method is adopted to perform a uniformly dispersion of Cu into W matrix. According to the impregnation method, W powder is compressed and formed into a porous presintered body (hereinafter referred to as "skeleton"), and the W skeleton is then impregnated with molten copper.

According to the impregnation method, it is easy to obtain a product having high density. However, it is difficult to uniformly disperse Cu throughout the entire W skeleton. That is, there remain parts into which molten copper is undispersed or insufficiently dispersed. As a result, it is inevitable that defects are formed such as pinholes, in the inner parts of the sintered body and on the surface layer of the sintered body.

When the substrate material involving pinholes is coated with a Ni or Au plating layer, other defects, such as blisters or unplated parts are formed in the plating layer. Further, the adherence of the plating layer to the substrate material is poor, so that the plating layer is likely to peel off the surface of the substrate material. Consequently, the junction of the substrate and the semiconductor device mounted thereon is deteriorated, and the contact resistance between the substrate and the semiconductor device becomes larger. A sufficient contact to diffuse a sufficient amount of heat flux is not formed between the semiconductor device and the substrate. Accordingly, the semiconductor device is overheated during operation, resulting in malfunctions and troubles.

SUMMARY OF THE PRESENT INVENTION

An object of the present invention is to provide a substrate material which overcomes the abovementioned defects.

Another object of the present invention is to offer a new substrate material wherein a component, such as Cu or Ag, which is excellent in thermal and electric conductivities, is uniformly dispersed in a W or Mo skelton without the formation of any insufficiently impregnated parts or pinholes.

Still another object of the present invention is to mount a semiconductor device on a substrate through a junction plane which is excellent in thermal transmission while substantially inhibiting the formation of thermal stress in the junction plane.

According to the present invention, there is provided a substrate material for mounting a semiconductor device thereon, which comprises a W and/or Mo skeleton prepared by liquid-phase sintering the powdery composition of W and/or Mo in which Cu and/or Ag powder is uniformed dispersed, and a Cu and/or Ag phase diffused into the pores of the W and/or Mo skeleton, wherein the total amount of Cu and/or Ag in a final product is adjusted to 10-50 vol. %.

Said substrate material is manufactured by the steps of; uniformly blending a powdery composition of W and/or Mo premixed with a part of Cu and/or Ag powder, liquid-phase sintering the powdery composition to form a porous skelton, and then infiltrating the remainder of Cu and/or Ag in a molten state into the pores of the skeleton while controlling the total amount of Cu and/or Ag in a final product within the range of 10–50 vol. %.

Herein, one or more oxides such as CuO, AgO, WO$_3$ and MoO$_3$ may be used as starting material for the powdery composition. In this case, the powdery oxides are uniformly blended and then co-reduced into a metallic state to prepare the powdery composition.

In order to eliminate pinholes which have a bad influence on thermal conductivity and plating, it is necessary to uniformly infiltrate Cu and/or Ag in a molten state throughout a skeleton prepared by sintering W and/or Mo powder. According to the present invention, the infiltration of Cu and/or Ag is improved by using the W and/or Mo sintered body which is premixed with a predetermined amount of Cu and/or Ag.

The sintered body prepared by liquid-phase sintering a powdery composition of W premixed with Cu has atoms are dispersed throughout the W skeleton. Due to the content of Cu, the W skeleton shows a good affinity to molten Cu, so that Cu in molten state is uniformly dispersed throughout the W skeleton during infiltration.

The other objects and features of the present invention will be apparent from the following description with reference to the drawings attached.

DETAILED DESCRIPTION OF THE PREFERRED EMBODIMENT

Figure 1A:
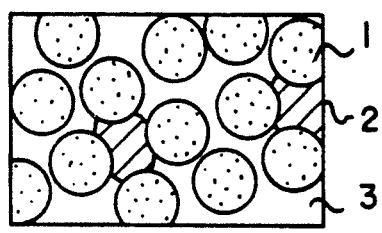
FIGS. 1a–1d illustrate the structures resulting during progressive stages of the sintering reaction according to the present invention.

A Cu-containing skeleton is prepared as follows. W particles 1 are mixed with Cu powder 2 and compressed into a predetermined body having pores 3 (see FIG. 1a). When the compressed body is heated and liquid-phase sintered at a temperature above the melting point of Cu, the Cu powder 2 is melted and applied as a coating 4 onto the surface of the W particles 1. The Cu coating 4 acts as a binder to connect the W particles each other, so as to form a skeleton.

Figure 1B:
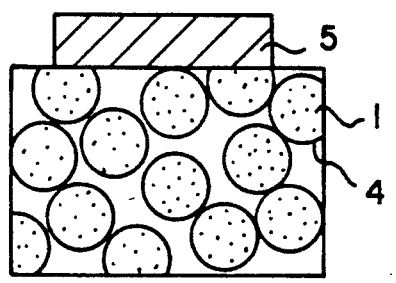
Figure 1C:
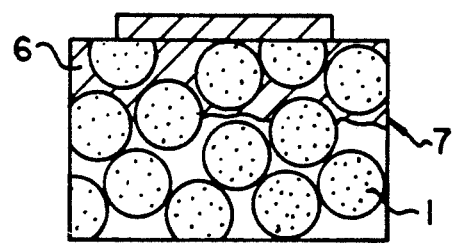

An infiltrating Cu material 5 is disposed on a part of the skeleton (see FIG. 1b), and heated at a temperature above the melting point of Cu. As a result, molten Cu 6 formed from the infiltrating material 5 is dispersed into the skeleton. The Cu coating 4 formed on the surface of the W particles acts as a priming guide for the infiltration of the molten Cu 6. Consequently, the front plane of the molten Cu 7 advances along the infiltrating direction uniformly over the whole section of the skeleton (see FIG. 1c).

Figure 1D:
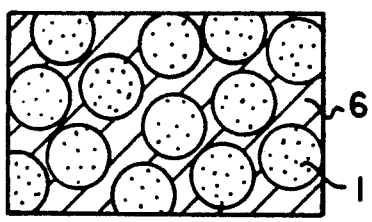
Figure 2A:
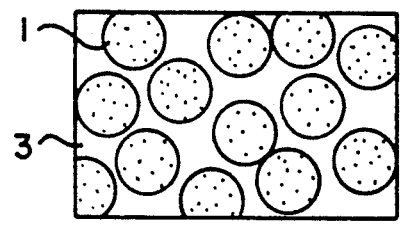
FIGS. 2a–2d illustrate the similar structures resulting during progressive stages of the sintering reaction according to a conventional impregnation sintering method.
Figure 2B:
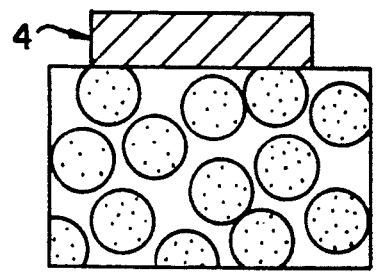
Figure 2C:
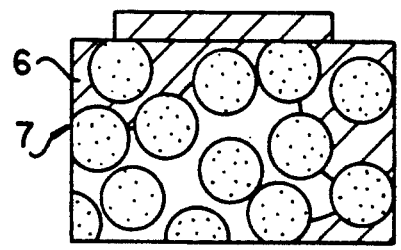
Figure 2D:
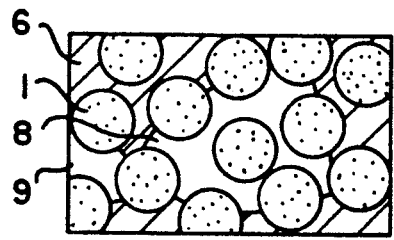

Owing to the uniform advance of the front plane 7, the pores 3 are completely filled with the molten Cu 6, and Cu atoms are uniformly dispersed into the whole body of the skeleton (see FIG. 1d). Thus, a sintered body free of pinholes is obtained.

By contrast impregnation occurs as shown in FIGS. 2a–2d according to a conventional impregnation sintering method. In this method, a starting material is prepared by compressing and then presintering W particles 1 (see FIG. 2a). An impregnating material 4 is disposed on the obtained skeleton (see FIG. 2b), and then heated to disperse molten Cu into the skelton in the same way. The W particles 1 are not covered with the Cu coating, so that the molten Cu 6 advances preferentially along passages which have small resistance to the flow of the molten Cu (see FIG. 2c). That is, the front plane of the molten Cu 7 becomes irregular along the impregnating direction. As a result, insufficiently impregnated parts 8 and unfilled pores 9 remain at the final stage of the sintering reaction. These parts 8 and pores 9 causes the formation of pinholes.

From the comparison of the sintering progress in the present invention (FIGS. 1a–1d) with that in the conventional impregnation sintering method, it is apparent that the Cu coating 4 is effective to promote the uniform dispersion of molten Cu. As a result, the molten Cu is dispersed throughout the W matrix, so as to obtain the Cu-W sintered body which does not have defects such as insufficiently infiltrated parts or unfilled pores exhibiting bad influences on thermal conductivity and plating. The resulting sintered body has the structure that Cu atoms are uniformly dispersed into the whole body without formation of pinholes. Owing to this specified structure, the sintered body exhibits stable properties compared the a substrate material prepared by the conventional impregnation sintering method. The characteristics of the sintered body are uniform over the whole body without any localized variations.

The structure according to the present invention is also effective in the formation of a plating layer. Since the surface of the sintered body is free from pinholes, a Ni or Au plating layer can be applied onto the surface of the sintered body without the formation of defects such as blisters or unplated parts. Consequently, when a semiconductor device is bonded through the plating layer to the substrate made of the sintered body, the resulting junction plane between the substrate and the semiconductor device is free from any gaps which would cause the lowering of contact resistance. In this regards, the diffusion of heat from the semiconductor device to the substrate is promoted.

In addition, the thermal expansion coefficient of the sintered body can be freely controlled by changing the total content of Cu and/or Ag, in a manner such that the thermal expansion coefficient becomes similar to that of the semiconductor device to be mounted on the substrate. Owing to this controlled thermal expansion coefficient as well as the excellent thermal conductivity, the resulting substrate is especially suitable for mounting a densely integrated semiconductor device.

In order to promote the uniform dispersion of molten Cu into the W skeleton, it is preferable to select the preparation and blending conditions for completely crushing secondary particles. For instance, secondary W particles are crushed and removed by HF treatment or blending methods using a ball mill or by attritor. Thereby, the formation of insufficienly infiltrated parts deriving from secondary W particles is inhibited.

Powdery W and Cu materials may be treated by a mechanical alloying method as well as a mechanical blending method using a ball mill or attritor, to facilitate the uniform dispersion of Cu powder in the W matrix.

Oxides such as WO$_3$ and CuO may be used as starting materials. These oxides are crushed and blended, and the resulting powdery composition is converted into a metallic W-Cu composition by a co-reducing method.

The amount of Cu and/or Ag to be premixed in W or Mo powder is preferably adjusted to a level below 15 vol. %, taking into consideration the affinity of molten Cu and/or Ag to the W or Mo skeleton during infiltration. When the premixing amount of Cu and/or Ag exceeds 15 vol. %, the property of an obtained sintered body is likely to fluctuate as shown in the following examples. This defect might be caused by the fact that the Cu phase acting as a binder for bonding Cu particles becomes sufficient to aggravate the formation of closed pores in the presintered body.

The lowest limit of the premixing amount of Cu and/or Ag is not especially critical, but a premixing amount not less than 0.1 vol. % is preferable to improve the affinity of Cu and/or Ag to the skeleton.

In order to facilitate the formation of a skeleton having a predetermined porosity, a small amount of a third component, e.g. Ni, Fe or Co, may be added to promote a catalytic sintering reaction. For instance, a sintered W body having a skeleton structure can be obtained at a relatively lower temperature by adding Ni in an amount of 0.5 vol. % or less to accelerate the sintering reaction. When catalytic sintering reaction is brought out, shrinkage becomes large in volume. Thus, the porosity of the skeleton can be easily controlled. The addition of the third component is effective, especially for the composition containing a small amount of Cu.

EXAMPLE 1

W powder of 3 μm average particle size was premixed with Cu powder at each ratio shown in Table 1, and then blended in a ball mill. The powdery composition was compressed and heated at a temperature above the melting point of Cu. Therby, the powdery composition was liquid-phase sintered, and the obtained sintered body had a porous skeleton structure. For comparison, W powder without the addition of Cu powder was sintered in the same way.

Each presintered body was subjected to the infiltration of molten Cu or impregnated with molten Cu in a manner such that an amount of Cu in the final sintered body was adjusted to 35 vol. %.

TABLE 1

| | | Composition of Substrate Material | | |
|---|---|---|---|---|
| mfg. type | sample No. | preadding amount (vol. %) Cu | Ni | total amount of Cu in final product (vol. %) |
| infiltration | 1 | 0.05 | — | 35 |
| infiltration | 2 | 0.1 | — | 35 |
| infiltration | 3 | 5.0 | — | 35 |
| infiltration | 4 | 10.0 | — | 35 |
| infiltration | 5 | 15.0 | — | 35 |
| infiltration | 6 | 1.0 | 0.5 | 35 |
| infiltration | 7 | 1.0 | 1.0 | 35 |
| impregnation | 8 | — | — | 35 |

The obtained sintered body was mechanically worked, and 20 test pieces of 5×15×30 mm in size were cut out from each sintered body. The properties of each testpiece were analyzed, and the presence of pinholes in the testpiece was investigated by fluorecent penetrant inspection. The results are shown in Table 2.

TABLE 2

| | Property of Sintered Body | | | |
|---|---|---|---|---|
| | physical property | | | ratio of detected |
| sample No. | specific gravity | thermal expansion coefficient | thermal conductivity | pinholes (%) |
| 1 | 15.4 ± 0.2 | 8.7 ± 0.3 | 0.52 ± 0.3 | 5 |
| 2 | 15.5 ± 0.2 | 8.4 ± 0.3 | 0.56 ± 0.3 | 0 |
| 3 | 15.6 ± 0.1 | 8.5 ± 0.3 | 0.58 ± 0.3 | 0 |
| 4 | 15.6 ± 0.2 | 8.5 ± 0.3 | 0.58 ± 0.3 | 0 |

TABLE 2-continued

| | Property of Sintered Body | | | |
|---|---|---|---|---|
| | physical property | | | ratio of detected |
| sample No. | specific gravity | thermal expansion coefficient | thermal conductivity | pinholes (%) |
| 5 | 15.5 ± 0.4 | 8.5 ± 0.6 | 0.58 ± 0.5 | 0 |
| 6 | 15.6 ± 0.2 | 8.5 ± 0.3 | 0.55 ± 0.3 | 0 |
| 7 | 15.6 ± 0.2 | 8.5 ± 0.2 | 0.32 ± 0.2 | 0 |
| 8 | 15.5 ± 0.2 | 8.4 ± 0.3 | 0.58 ± 0.2 | 15 | note:
thermal expansion coefficient ($\times 10^{-6}/°C.$)
thermal conductivity (cal/cm · sec · °C.)

It is noted from Table 1 that lots of pinholes were detected in the sample No. 8 (as comparison) prepared by applying impregnation to a skeleton not-containing Cu. By contrast, the formation of pinholes was substantially suppressed in the samples No. 1-7 prepared by infiltrating molten Cu into the Cu-containing skeleton. Even in the sample No. 1 using the skeleton containing only 0.05 vol. % Cu, the ratio of pinholes was reduced to 5%. When the Cu content in the skeleton exceeded 0.1 vol. %, substantially no pinholes were detected.

A substrate made from the obtained sintered body was coated with a Ni plating layer of 3 μm in thickness and then a Au plating layer of 0.3 μm in thickness by an electroless plating method. A Si semiconductor device was bonded through the plating layers to the substrate. The junction plane between the semiconductor device and the substrate was investigated.

The adherence of the semiconductor device to the substrate manufactured according to the present invention was supremely excellent. Heat generated in the Si semiconductor device during operation was sufficiently transmitted through the junction plane to the substrate and diffused to the atmosphere. Consequently, the semiconductor device was operated at a temperature below its rated value without malfunction.

By contrast, as for a Si semiconductor device mounted on a substrate manufactured by the conventional impregnation sintering method, there were detected air gaps between the semiconductor device and the substrate. Due to the formation of air gaps, which acted as a heat insulator, the actual thermal conductivity of the substrate was lower than that of the substrate material itself shown in Table 2.

EXAMPLE 2

W powder of 3 μm average particle size was premixed with Cu and Ni powders at ratios shown in Table 1. A presintered body having a skeleton structure was prepared from the powdery composition in the same way as Example 1, and then molten Cu was infiltrated into the presintered body. Test pieces were cut out from the resulting sintered body, and their properties were ascertained. The results are also shown in Table 2. It is noted from Table 2 that the amount of Ni is preferably 0.5 vol. % or less to improve thermal conductivity.

EXAMPLE 3

W powder of 3 μm average particle size was premixed with 2 vol. % Cu powder and sintered to form a skeleton structure. Molten Cu was then infiltrated into the sintered body in a manner such that the total amount of Cu in a final product was adjusted from between 5 to 60 vol. %. Testpieces were cut out from the obtained sintered body, to ascertain the physical properties. The results are shown in Table 3.

TABLE 3

Effect of Cu content on Property of Substrate Material

| sample No. | total content of Cu (vol. %) | relative density (%) | thermal expansion coefficient ($\times 10^{-6}$/°C.) |
|---|---|---|---|
| 9 | 5 | 98.3 | 5.0 |
| 10 | 10 | 99.9 | 5.4 |
| 11 | 30 | 100.0 | 7.5 |
| 12 | 50 | 100.0 | 9.8 |
| 13 | 60 | 99.8 | 11.6 |

It is noted from Table 3 that Sample No. 9 containing a small amount of Cu had a relatively low specific gravity. By contrast, Sample No. 9 containing a large amount of Cu had a thermal expansion coefficient exceeding $10 \times 10^{-6}$/°C. Taking into consideration that a semiconductor device has a thermal expansion coefficient of about $(1-10) \times 10^{-6}$/°C. in general, it is desirable that the total amount of Cu in the final product is adjusted within the range of 10-50 vol. % to reduce a difference in thermal expansion between the substrate and the semiconductor device.

Other substrate materials, e.g. Cu-Mo, Ag-W and Ag-Mo, were manufactured in the same way. In these case, W or Mo powder was premixed with Cu or Ag powder and then compressed. The compressed body was liquid-phase sintered to form a porous skeleton structure. Thereafter, molten Cu or Ag was infiltrated into the presintered body, while adjusting the total amount of Cu or Ag in a final product to a predetermined value.

The obtained product was a sintered body wherein Cu or Ag atoms were infiltrated throughout a skeleton structure without the formation of defects such as pinholes. A substrate having a predetermined size was cut out from the sintered body and then coated with Ni and Au plating layers. A semiconductor device was mounted on the coated substrate with an excellent junction plane free from air gaps.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A method of manufacturing a substrate material for a semiconductor device, consisting essentially of the steps of:
    a) uniformly blending a particulate mixture of W and/or Mo powder with a small amount of Cu and/or Ag powder sufficient to coat the surface of said W and/or Mo powder,
    b) liquid-phase sintering the blended particulate mixture, at a temperature above the melting point of the Cu and/or Ag powder, thereby melting said Cu and/or Ag and forming an induction coating on the surface of the W and/or Mo powder of the melted Cu and Ag, thus forming a porous skeleton in the shape of a plate,
    c) applying additional Cu and/or Ag on the skeleton plate,
    d) melting the additional Cu and/or Ag, thereby infiltrating an amount of molten Cu and/or Ag into the intersticial pores of said skeleton using said induction coating as a guide, wherein the amount of molten Cu and/or Ag is such that the total amount of Cu and/or Ag in the substrate material about 10-50 vol. % based on the volume of the whole substrate material, and
    e) forming a plated layer on the surface of the plate.

2. A method of manufacturing a substrate material as defined in claim 1 wherein the W and/or Mo powder and the Cu and/or Ag powder are oxides.

3. A method as claimed in claim 1 wherein substantially all of the pores of said porous skeleton are filled with said additional molten Cu and/or Ag.

4. A substrate article for a semiconductor device made by the process of:
    a) substantially uniformly blending a particulate mixture consisting essentially of W and/or Mo powder with a small amount of Cu and/or Ag powder sufficient to coat the surface of said W and/or Mo,
    b) heating the blended particulate mixture, at a temperature above the melting point of the Cu and/or Ag powder sufficient to melt said Cu and/or Ag, thereby forming an induction coating on the surface of the W and/or Mo powder with Cu and/or Ag, adhering together said coated powder, and forming a porous skeleton in the shape of a plate,
    c) disposed an amount of additional Cu and/or Ag such that the total amount of Cu and/or Ag in the substrate article is about 10-50 vol. % of the substrate material on the surface of said skeleton plate,
    d) heating said additional Cu and/or Ag sufficient to melt such,
    e) infiltrating molten Cu and/or Ag into the pores of said skeleton,
    f) solidifying said Cu and/or Ag, and
    g) forming a plated layer of Ag or Ni on the surface of the plate.

5. An article as claimed in claim 4 wherein substantially all of the pores of said porous skeleton are filled with said additional molten Cu and/or Ag.

* * * * *

UNITED STATES PATENT AND TRADEMARK OFFICE
CERTIFICATE OF CORRECTION

PATENT NO.  : 5,167,697

DATED       : December 1, 1992

INVENTOR(S) : KOUMURA et al

It is certified that error appears in the above-identified patent and that said Letters Patent is hereby corrected as shown below:

On the Title page, item [75]

Change name of first inventor from "TAKESHIE" to --TAKESHI--.

Signed and Sealed this

Ninth Day of November, 1993

Attest:

BRUCE LEHMAN

Attesting Officer

Commissioner of Patents and Trademarks